United States Patent
Okazaki et al.

(10) Patent No.: US 6,693,941 B1
(45) Date of Patent: Feb. 17, 2004

(54) SEMICONDUCTOR LASER APPARATUS

(75) Inventors: Yoji Okazaki, Kaisei-machi (JP);
Toshiaki Fukunaga, Kaisei-machi (JP)

(73) Assignee: Fuji Photo Film Co., Ltd., Kanagawa-ken (JP)

(*) Notice: Subject to any disclaimer, the term of this patent is extended or adjusted under 35 U.S.C. 154(b) by 95 days.

(21) Appl. No.: 09/656,700

(22) Filed: Sep. 7, 2000

(30) Foreign Application Priority Data

Sep. 10, 1999 (JP) ............................................. 11/257530
Oct. 14, 1999 (JP) ............................................. 11/292557
Feb. 23, 2000 (JP) ....................................... 2000/046177

(51) Int. Cl.$^7$ ......................... H01S 3/0941; H01S 3/091
(52) U.S. Cl. ............................... 372/75; 372/70; 372/71
(58) Field of Search .............................. 372/75, 70, 71, 372/43–45, 22

(56) References Cited

U.S. PATENT DOCUMENTS

| | | | | | |
|---|---|---|---|---|---|
| 4,670,689 | A | * | 6/1987 | Suzuki | 313/499 |
| 5,461,637 | A | * | 10/1995 | Mooradian et al. | 372/92 |
| 5,627,853 | A | | 5/1997 | Mooradian et al. | |
| 6,125,132 | A | * | 9/2000 | Okazaki | 372/75 |
| 6,167,068 | A | * | 12/2000 | Caprara et al. | 372/22 |
| 6,324,203 | B1 | * | 11/2001 | Owa | 372/75 |
| 6,327,293 | B1 | * | 12/2001 | Salokatve et al. | 372/96 |
| 6,594,297 | B1 | * | 7/2003 | Hayakawa | 372/75 |

OTHER PUBLICATIONS

Schneider, Jr., et al, "Visible (657 nm) InGaP/InAlGaP strained quantum well vertical–cavity surface–emitting laser." Applied Physics Letters, vol. 60, No. 15, Apr. 13, 1992, pp. 1830–1832.*

Japanese Journal of Applied Physics, vol. 37, p. L1020, 1998.

IEEE Photonoics Technology Letters, vol. 11, p. 791, Jul. 1999.

IEEE Journal of Selected Topics in Quantum Electronics, vol. 5, p. 561, May/Jun. 1999.

* cited by examiner

*Primary Examiner*—Paul Ip
*Assistant Examiner*—James Menefee
(74) *Attorney, Agent, or Firm*—Stroock & Stroock & Lavan LLP

(57) ABSTRACT

A semiconductor laser apparatus comprises a pumping beam source and a surface emission type of semiconductor device. The pumping beam source is constituted of a semiconductor laser device, in which a composition selected from the group consisting of InGaN and GaN is employed in an active layer. The surface emission type of semiconductor device comprises a substrate, and an active layer, which is constituted of a composition selected from the group consisting of InGaAlP and InGaP and is provided on the substrate. The surface emission type of semiconductor device is pumped by the pumping beam source to produce a laser beam. The semiconductor laser apparatus produces the laser beam having a wavelength of a red region or an ultraviolet region and undergoes oscillation in a fundamental mode with a high reliability and a high efficiency and up to a high output power.

2 Claims, 13 Drawing Sheets

SEMICONDUCTOR LASER APPARATUS

BACKGROUND OF THE INVENTION

1. Field of the Invention

This invention relates to a semiconductor laser apparatus. This invention particularly relates to a surface emission type of semiconductor laser apparatus, in which a semiconductor laser device is employed as a pumping beam source.

2. Description of the Related Art

With the rapid advances made in functions and performance of optical information processing apparatuses, image processing apparatuses, printing apparatuses, and the like, in recent years, there has arisen a strong demand for semiconductor laser devices having high output power and capable of producing laser beams of high quality.

As a short-wavelength semiconductor laser device, which produces a laser beam having a wavelength of a 410 nm band, there has heretofore been proposed a semiconductor laser device comprising a GaN substrate, an n-GaN buffer layer, an n-InGaN anti-cracking layer, an AlGaN/n-GaN modulation-doped superlattice cladding layer, an n-GaN optical waveguide layer, an undoped InGaN/n-InGaN multiple quantum well active layer, a p-AlGaN carrier blocking layer, a p-GaN optical waveguide layer, an AlGaN/p-GaN modulation-doped superlattice cladding layer, and a p-GaN contact layer, which layers are formed on the GaN substrate. The GaN substrate is obtained by forming GaN on a sapphire substrate, growing GaN by the utilization of selective growth and by use of $SiO_2$ as a mask, and thereafter separating the sapphire substrate. Such a semiconductor laser device is reported in, for example, "Jpn. J. Appl. Phys.," vol. 37, pp. L1020, 1998. However, with the proposed semiconductor laser device, wherein a stripe width is as narrow as 2 μm, only an optical output power of as low as 100 mW can be obtained.

As for a semiconductor laser device for producing a red laser beam, it has been reported in, for example, "IEEE Photonics Technology Letters," Vol. 11, pp. 791, 1999, that a single-mode semiconductor laser, which produces a laser beam having a wavelength of 660 nm with an output power of 400 mW, has been achieved. However, the reported semiconductor laser device has the problems in that a side lobe arises in a transverse mode, and good beam characteristics cannot be obtained. Also, though the reported semiconductor laser device has a broad area structure, the reported semiconductor laser device has the problems in that, since the end face optical density is high, it is difficult for the output power to be enhanced even further, and the reliability with the passage of time is low. As for single-stripe semiconductor laser devices for producing a red laser beam, attempts have heretofore been made to employ a window structure for enhancing the output power and accomplishing oscillation in a fundamental mode. However, currently, with the single-stripe semiconductor laser devices for producing a red laser beam, which have the window structure, the output power is practically limited to approximately 50 mW.

Different examples of techniques for enhancing the output power include semiconductor laser pumped second-harmonic-generation (SHG) solid lasers. However, the semiconductor laser pumped SHG solid lasers have the problems in that, since the life of the fluorescence produced by the rare earth element of the laser crystal is markedly long, it is difficult for the laser beam produced by the solid laser to be modulated quickly with direct modulation of the pumping semiconductor laser. Also, the semiconductor laser pumped SHG solid lasers have the problems in that, since the second harmonic is utilized, the efficiency cannot be kept high.

As a laser device having a high output power and undergoing oscillation in a fundamental transverse mode, a semiconductor laser pumped, surface emission type of laser device, in which an AlGaAs type of semiconductor is employed, is described in, for example, U.S. Pat. No. 5,627,853. However, in U.S. Pat. No. 5,627,853, as for a technique for producing a laser beam having a wavelength shortened even further, it is described only that the SHG is utilized. In U.S. Pat. No. 5,627,853, nothing is described about a surface emission type of laser device, which produces a laser beam having a short wavelength with a high efficiency and in which the SHG is not utilized.

As lasers for producing a laser beam having a wavelength of an ultraviolet region, solid lasers, which produces a laser beam having a wavelength shorter than 400 nm and utilizes third harmonic generation (THG) driven in a pulsed mode, have heretofore been used in practice. However, the solid lasers utilizing the THG have the problems in that the efficiency cannot be kept high in producing a continuous wave (CW) with the THG, and therefore the solid lasers are not practical. Also, in order for the oscillation in the CW mode of the THG to be achieved at a high efficiency, the second harmonic of the fundamental wave must be resonated. In such cases, the temperature of the resonator must be controlled at a markedly high accuracy of within 0.01° C. The strict control requirement also makes the solid lasers utilizing the THG unpractical. Further, as a different technique for producing a laser beam having a wavelength of the ultraviolet region, it may be considered to obtain an ultraviolet laser beam having a wavelength shorter than 400 nm with the generation of the second harmonic of a beam produced by a Cr:LiSAF or Cr:LiCAF crystal. However, in such cases, since re-absorption of the beam produced by the Cr:LiSAF or Cr:LiCAF crystal occurs, it is difficult for a beam having a wavelength falling within the range of 700 nm to 800 nm to be produced efficiently.

Also in U.S. Pat. No. 5,627,853, nothing is described about a laser device for producing a laser beam having a wavelength of the ultraviolet region.

As described above, with the conventional semiconductor laser devices for producing a laser beam having a wavelength of the red region, it is difficult for a high output power and oscillation in the fundamental mode to be obtained.

Also, as for the laser devices for producing a laser beam having a wavelength of the ultraviolet region, a high-efficiency wavelength converting laser, in which a surface emission laser is utilized and the SHG of the ultraviolet region is utilized, has not been proposed in the past.

SUMMARY OF THE INVENTION

The primary object of the present invention is to provide a semiconductor laser apparatus, which produces a laser beam having a wavelength of a red region, and which undergoes oscillation in a fundamental mode with a high reliability and a high efficiency and up to a high output power.

Another object of the present invention is to provide a semiconductor laser apparatus, which produces a laser beam having a wavelength of an ultraviolet region, and which undergoes oscillation in a fundamental mode with a high reliability and a high efficiency and up to a high output power.

The present invention provides a first semiconductor laser apparatus, comprising:

i) a pumping beam source constituted of a semiconductor laser device, in which a composition selected from the group consisting of InGaN and GaN is employed in an active layer, and ii) a surface emission type of semiconductor device comprising:

a) a substrate, and b) an active layer, which is constituted of a composition selected from the group consisting of InGaAlP and InGaP and is provided on the substrate, the surface emission type of semiconductor device being pumped by the pumping beam source to produce a laser beam.

InGaN generally means compounds represented by $In_XGa_{1-X}N$ (where $0<X<1$).

The present invention also provides a second semiconductor laser apparatus, comprising:

i) a pumping beam source constituted of a semiconductor laser device, in which a composition selected from the group consisting of InGaN and GaN is employed in an active layer, and ii) a surface emission type of semiconductor device comprising:

a) a substrate, b) a semiconductor layer, which is overlaid on the substrate and contains an active layer constituted of a composition selected from the group consisting of InGaAlP and InGaP, and c) mirrors, each of which is provided on one of two opposite end faces of the semiconductor layer, the two opposite end faces being taken with respect to a direction of overlaying of the semiconductor layer, InGaAlP and InGaP generally mean compounds represented by $In_X(Ga_YAl_{1-Y})_{1-X}P$ and $In_XGa_{1-X}P$, respectively, where $0<X<1$ and $0<Y<1$.

the surface emission type of semiconductor device being pumped by the pumping beam source to produce a laser beam.

The present invention further provides a third semiconductor laser apparatus, comprising:

i) a pumping beam source constituted of a semiconductor laser device, in which a composition selected from the group consisting of GaNAs and InGaNAs is employed in an active layer, and ii) a surface emission type of semiconductor device comprising:

a) a substrate, and b) an active layer, which is constituted of a composition selected from the group consisting of InGaAlP and InGaP and is provided on the substrate, the surface emission type of semiconductor device being pumped by the pumping beam source to produce a laser beam.

The present invention still further provides a fourth semiconductor laser apparatus, comprising:

i) a pumping beam source constituted of a semiconductor laser device, in which a composition selected from the group consisting of GaNAs and InGaNAs is employed in an active layer, and ii) a surface emission type of semiconductor device comprising:

a) a substrate, b) a semiconductor layer, which is overlaid on the substrate and contains an active layer constituted of a composition selected from the group consisting of InGaAlP and InGaP, and c) mirrors, each of which is provided on one of two opposite end faces of the semiconductor layer, the two opposite end faces being taken with respect to a direction of overlaying of the semiconductor layer, the surface emission type of semiconductor device being pumped by the pumping beam source to produce a laser beam.

GaNAs and InGaNAs generally mean compounds represented by $GaN_XAs_{1-X}$ and $In_YGa_{1-Y}N_XAs_{1-X}$, respectively, where $0<X<1$ and $0<Y<1$.

The present invention also provides a fifth semiconductor laser apparatus, comprising:

i) a pumping beam source constituted of a semiconductor laser device, in which a composition selected from the group consisting of InGaN and GaN is employed in an active layer, ii) a surface emission type of semiconductor device comprising:

a) a substrate, b) an active layer, which is constituted of a composition selected from the group consisting of InGaAlP and InGaP and is provided on the substrate, and c) a mirror, which is formed on a substrate-facing side of the active layer of the surface emission type of semiconductor device or the other side of the active layer opposite to the substrate-facing side, the surface emission type of semiconductor device being pumped by the pumping beam source, and iii) an external mirror, which is located at an exterior of the surface emission type of semiconductor device and constitutes a resonator in co-operation with the mirror of the surface emission type of semiconductor device, a laser beam being radiated out from the external mirror.

The present invention further provides a sixth semiconductor laser apparatus, comprising:

i) a pumping beam source constituted of a semiconductor laser device, in which a composition selected from the group consisting of GaNAs and InGaNAs is employed in an active layer, ii) a surface emission type of semiconductor device comprising:

a) a substrate, b) an active layer, which is constituted of a composition selected from the group consisting of InGaAlP and InGaP and is provided on the substrate, and c) a mirror, which is formed on a substrate-facing side of the active layer of the surface emission type of semiconductor device or the other side of the active layer opposite to the substrate-facing side, the surface emission type of semiconductor device being pumped by the pumping beam source, and iii) an external mirror, which is located at an exterior of the surface emission type of semiconductor device and constitutes a resonator in co-operation with the mirror of the surface emission type of semiconductor device, a laser beam being radiated out from the external mirror.

The first, second, third, fourth, fifth, and sixth semiconductor laser apparatuses in accordance with the present invention should preferably be modified such that the semiconductor laser device is provided with a stripe-shaped electric current injection window, and a stripe width constituting the electric current injection window is at least 5 $\mu$m.

Also, in the first, second, third, fourth, fifth, and sixth semiconductor laser apparatuses in accordance with the present invention, the laser beam should preferably have a wavelength falling within the range of 600 nm to 700 nm.

The present invention still further provides a seventh semiconductor laser apparatus, comprising:
- i) a semiconductor laser device, in which a GaN type of semiconductor is employed as an active layer,
- ii) a surface emission type of semiconductor device, in which a semiconductor selected from the group consisting of an InGaAlP type of semiconductor and an InGaP type of semiconductor is employed as an active layer,
  the surface emission type of semiconductor device being pumped by the semiconductor laser device, and
- iii) wavelength converting means for converting a wavelength of light obtained through the pumping and radiating out a laser beam having a wavelength of an ultraviolet region.

In the seventh semiconductor laser apparatus in accordance with the present invention, the active layer of the semiconductor laser device may have a composition selected from the group consisting of InGaN and GaN. Alternatively, in the seventh semiconductor laser apparatus in accordance with the present invention, the active layer of the semiconductor laser device may have a composition selected from the group consisting of GaNAs and InGaNAs.

The present invention also provides an eighth semiconductor laser apparatus, comprising:
- i) a semiconductor laser device, in which a GaN type of semiconductor is employed as an active layer,
- ii) a surface emission type of semiconductor device, in which a GaN type of semiconductor is employed as an active layer,
  the surface emission type of semiconductor device being pumped by the semiconductor laser device, and
- iii) wavelength converting means for converting a wavelength of light obtained through the pumping and radiating out a laser beam having a wavelength of an ultraviolet region.

In the eighth semiconductor laser apparatus in accordance with the present invention, the active layer of the semiconductor laser device may have a composition selected from the group consisting of InGaN, GaN, GaNAs, and InGaNAs.

With the first, second, and fifth semiconductor laser apparatuses in accordance with the present invention, the semiconductor laser device, in which the active layer is constituted of the composition selected from the group consisting of InGaN and GaN, is employed as the pumping beam source, and laser oscillation is obtained with the surface emission type of semiconductor device, in which the active layer is constituted of the composition selected from the group consisting of InGaAlP and InGaP. Therefore, a broad area type of semiconductor laser device can be utilized as the pumping semiconductor laser device, and a high output power falling within the range of, for example, 1 W to 10 W can be obtained with the semiconductor laser device. Accordingly, a semiconductor laser apparatus, which produces a laser beam having a wavelength of the red region and has an output power falling within the range of several hundreds of milliwatts to several watts, can be obtained.

Also, with the first, second, and fifth semiconductor laser apparatuses in accordance with the present invention, wherein the semiconductor laser device is employed as the pumping beam source, side mode-free oscillation in the fundamental transverse mode can be obtained with a high output power.

With the third, fourth, and sixth semiconductor laser apparatuses in accordance with the present invention, wherein the active layer of the semiconductor laser device is constituted of the composition selected from the group consisting of GaNAs and InGaNAs, as in the first, second, and fifth semiconductor laser apparatuses in accordance with the present invention, side mode-free oscillation in the fundamental transverse mode can be obtained, and a laser beam having a wavelength of the red region can thereby be produced.

With the fifth and sixth semiconductor laser apparatuses in accordance with the present invention, wherein the resonator is formed by the provision of the external mirror, even if a side lobe occurs, the side lobe can be restricted by inserting a slit, or the like, into the resonator.

The seventh semiconductor laser apparatus in accordance with the present invention for producing a laser beam having a wavelength of the ultraviolet region comprises the semiconductor laser device, in which the GaN type of semiconductor is employed as the active layer, and the surface emission type of semiconductor device, in which the semiconductor selected from the group consisting of the InGaAlP type of semiconductor and the InGaP type of semiconductor is employed as the active layer, the surface emission type of semiconductor device being pumped by the semiconductor laser device. The seventh semiconductor laser apparatus in accordance with the present invention also comprises the wavelength converting means for converting the wavelength of light obtained through the pumping and radiating out the laser beam having a wavelength of the ultraviolet region. Therefore, with the seventh semiconductor laser apparatus in accordance with the present invention, a laser beam, which is produced by the semiconductor laser device and has a wavelength of the 400 nm band, is absorbed by the surface emission type of semiconductor device, and light having a wavelength falling within the range of 600 nm to 700 nm is radiated out from the surface emission type of semiconductor device. The light radiated out from the surface emission type of semiconductor device is subjected to wavelength conversion, and a laser beam having a wavelength of the ultraviolet region can thereby be obtained.

The eighth semiconductor laser apparatus in accordance with the present invention for producing a laser beam having a wavelength of the ultraviolet region comprises the semiconductor laser device, in which the GaN type of semiconductor is employed as the active layer, and the surface emission type of semiconductor device, in which the GaN type of semiconductor is employed as the active layer, the surface emission type of semiconductor device being pumped by the semiconductor laser device. The eighth semiconductor laser apparatus in accordance with the present invention also comprises the wavelength converting means for converting the wavelength of light obtained through the pumping and radiating out the laser beam having a wavelength of the an ultraviolet region. Therefore, with the eighth semiconductor laser apparatus in accordance with the present invention, the surface emission type of semiconductor device, in which the GaN type of semiconductor is employed as the active layer, is pumped by a pumping beam, which is produced by the GaN type of semiconductor laser device and has a wavelength of the 380 nm band, and light having a wavelength falling within the range of 400 nm to 560 nm is radiated out from the surface emission type of semiconductor device. The light radiated out from the surface emission type of semiconductor device is subjected to wavelength conversion, and a laser beam having an extreme short wavelength of the ultraviolet region can thereby be obtained.

With the first to eighth semiconductor laser apparatuses in accordance with the present invention, wherein laser oscillation is caused to occur by optical pumping, the problems do not occur in that doping impurities, and the like, diffuse due to heat generated by an electric current as in an electric current injection type of semiconductor laser device. Therefore, deterioration with the passage of time due to short-circuiting does not occur, and the reliability can be enhanced. Also, the problems do not occur in that the contact resistance increases due to diffusion of the impurities. Therefore, the threshold current can be reduced, and a high efficiency can be achieved.

Further, with the first to eighth semiconductor laser apparatuses in accordance with the present invention, wherein the light emission area of the surface emission type of semiconductor device is broad, the advantages over the electric current injection type of semiconductor laser device can be obtained in that the optical density is low, and therefore oscillation in the fundamental mode can be performed up to a high output power. Furthermore, deterioration of the end face due to an increased optical density can be restricted, and therefore a long service life can be obtained.

Also, with the first to eighth semiconductor laser apparatuses in accordance with the present invention, direct modulation of the semiconductor laser device can be performed through electrical modulation, and a quickly modulated laser beam can be obtained.

Further, with the first to eighth semiconductor laser apparatuses in accordance with the present invention, wherein the semiconductor laser device is employed as the pumping beam source, a laser apparatus can be obtained, which has a high efficiency and which is capable of being produced at a low cost and undergoing a CW operation.

Furthermore, with the first to eighth semiconductor laser apparatuses in accordance with the present invention, wherein optical pumping is utilized, the problems do not occur in that Mg acting as a doping agent, and the like, diffuse as in the ordinary electric current injection type of semiconductor laser device. Therefore, deterioration with the passage of time due to short-circuiting does not occur, and the service life of the semiconductor laser apparatus can be kept long.

DESCRIPTION OF THE PREFERRED EMBODIMENTS

The present invention will hereinbelow be described in further detail with reference to the accompanying drawings.

Figure 1:
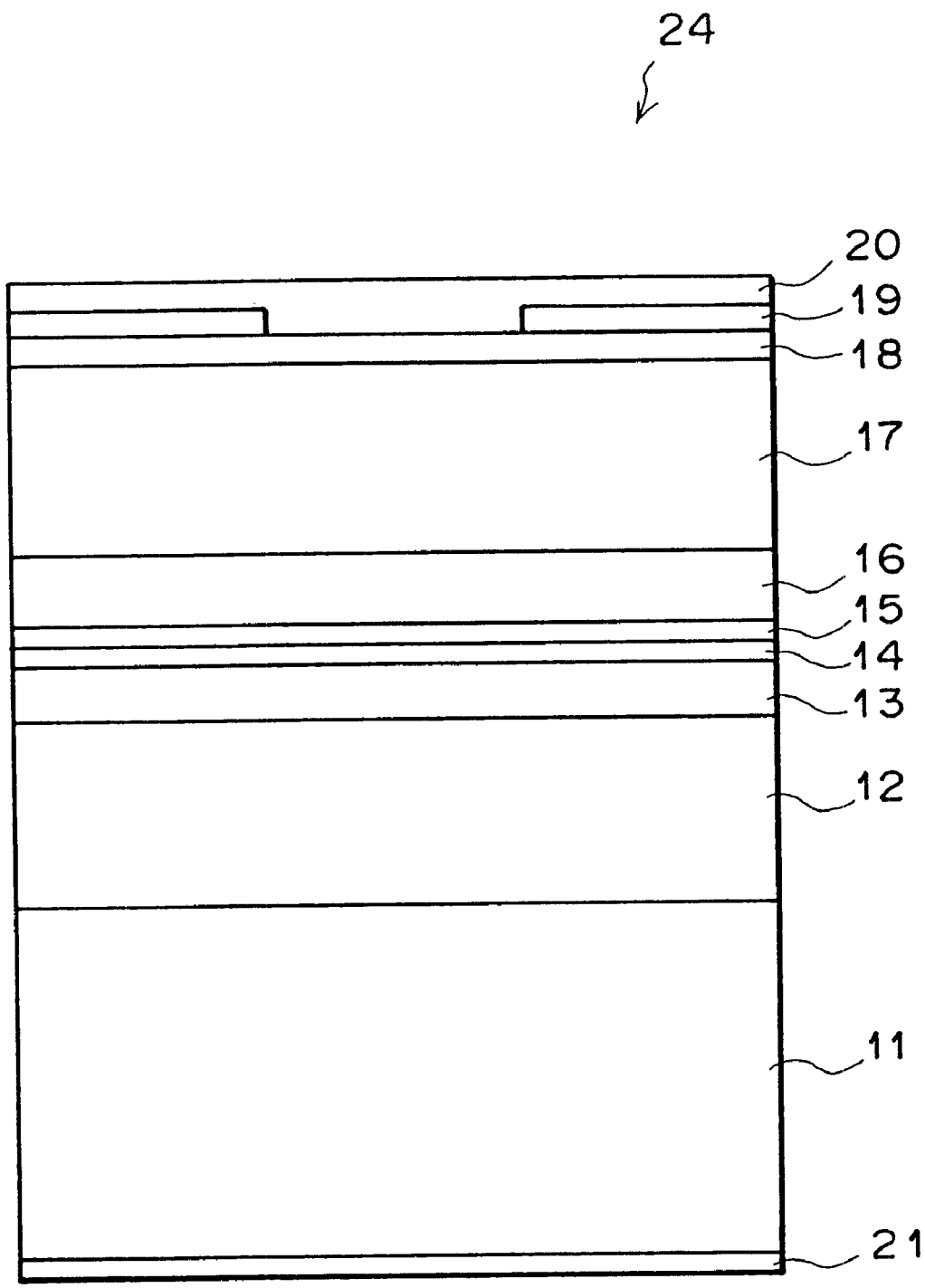
FIG. 1 is a sectional view showing a semiconductor laser device, which is employed in a first embodiment of the semiconductor laser apparatus in accordance with the present invention.
Figure 2:
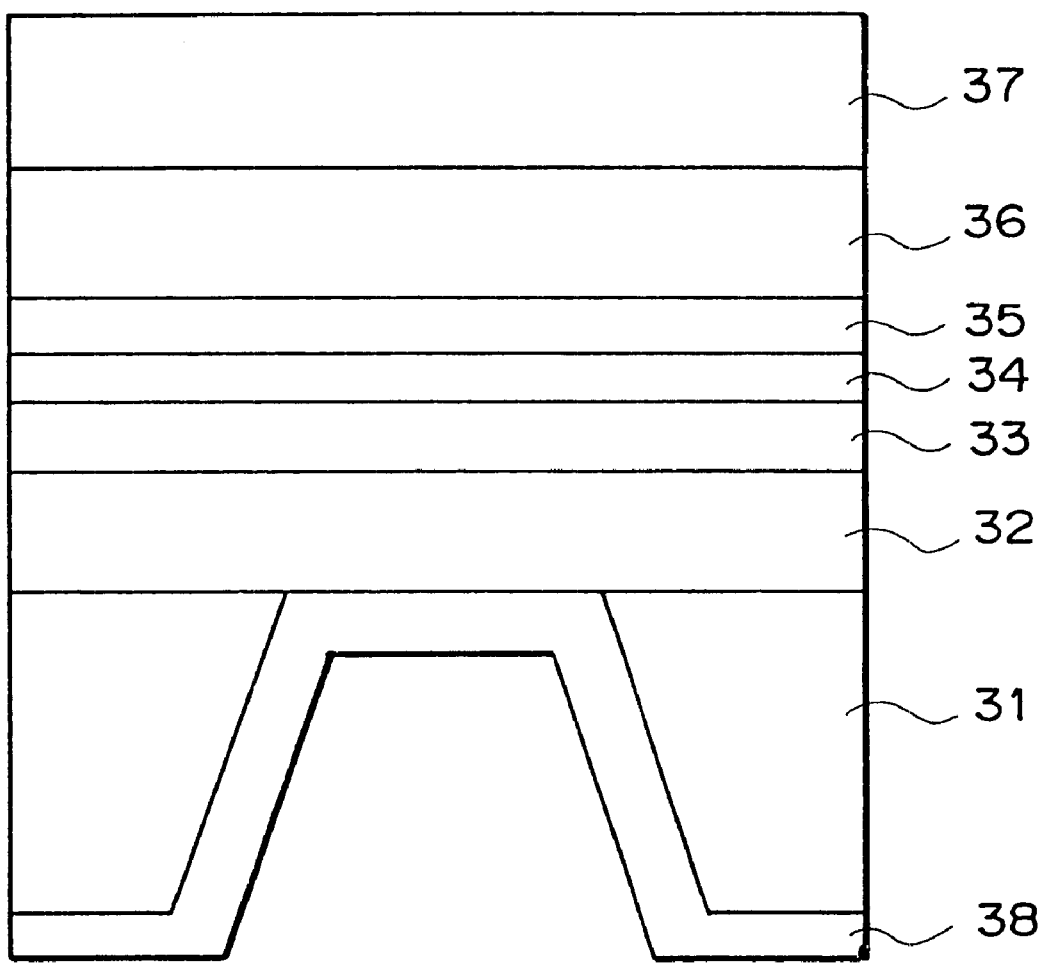
FIG. 2 is a sectional view showing a surface emission type of semiconductor device, which is employed in the first embodiment of the semiconductor laser apparatus in accordance with the present invention.

FIG. 1 is a sectional view showing a semiconductor laser device, which is employed as a pumping beam source in a first embodiment of the semiconductor laser apparatus in accordance with the present invention and which produces a pumping beam having a wavelength of a 360 nm band. FIG. 2 is a sectional view showing a surface emission type of semiconductor device, which is employed in the first embodiment of the semiconductor laser apparatus in accordance with the present invention and which is pumped by the pumping beam radiated out from the semiconductor laser device of FIG. 1 to undergo oscillation in a single transverse mode.

Firstly, how the semiconductor laser device, which is employed in the first embodiment of the semiconductor laser apparatus in accordance with the present invention, is constituted and produced will be described hereinbelow. An n-GaN (0001) substrate 11 is firstly formed in accordance with the technique described in "Jpn. Appl. Phys. Lett.," Vol. 37, pp. L1020, 1998. Specifically, the n-GaN (0001) substrate 11 is obtained by forming GaN on a sapphire substrate, growing GaN by the utilization of selective growth and by use of $SiO_2$ as a mask, and thereafter separating the sapphire substrate. Thereafter, as illustrated in FIG. 1, an n-$Ga_{1-z1}Al_{z1}N$/GaN superlattice cladding layer 12 (where 0<z1<1), an n- or i-GaN optical waveguide layer 13, an $In_{1-z2}Ga_{z2}N$ (Si-doped)/$In_{1-z3}Ga_{z3}N$ multiple quantum well active layer 14 (where 0<z2<z3<0.5), a p-$Ga_{1-z4}Al_{z4}N$ carrier blocking layer 15 (where 0<z4<0.5), an n- or i-GaN optical waveguide layer 16, a p-$Ga_{1-z1}Al_{z1}N$/GaN superlattice cladding layer 17 (where 0<z1<1), and a p-GaN contact layer 18 are formed in this order on the n-GaN (0001) substrate 11 and with a metalorganic chemical vapor deposition technique. Thereafter, an insulating film 19 is formed on the p-GaN contact layer 18. Also, a stripe-shaped region of the insulating film 19, which region has a width of approximately 100 μm, is removed with an ordinary lithographic technique, and a p-side electrode 20 is formed on the region of the p-GaN contact layer 18, which region corresponds to the removed stripe-shaped region of the insulating film 19 and is now laid bare, and on the remaining regions of the insulating film 19. Thereafter, the n-GaN (0001) substrate 11 is polished, an n-side electrode 21 is formed on the bottom surface of the n-GaN (0001) substrate 11, and a resonator is formed through cleavage. Thereafter, high-reflectivity coating and low-reflectivity coating are performed on the resonator, and chip formation is performed. In this manner, a semiconductor laser device 24 is obtained.

As described above, the active layer 14 has the composition of InGaN. Alternatively, the active layer 14 may have the composition of GaN, GaNAs, or InGaNAs.

How the surface emission type of semiconductor device, which is employed in the first embodiment of the semiconductor laser apparatus in accordance with the present invention, is constituted and produced will be described hereinbelow. In the explanation made below, $\lambda$ represents the wavelength of the laser beam produced through the optical pumping. Also, $n_{InAlP}$, $n_{InGaAlP}$, $n_{SiO2}$, and $n_{ZrO2}$ respectively represent the refractive indexes of InAlP, InGaAlP, SiO$_2$, and ZrO$_2$ with respect to the wavelength of the laser beam produced through the optical pumping.

As illustrated in FIG. 2, an $In_{0.5}(Ga_{1-x5}Al_{x5})_{0.5}P$ cladding layer 32, an $In_{0.5}(Ga_{1-x2}Al_{x2})_{0.5}P$ lower optical confinement layer 33, an $In_{0.5}(Ga_{1-x3}Al_{x3})_{0.5}P/In_{0.5}(Ga_{1-x4}Al_{x4})_{0.5}P$ multiple quantum well active layer 34, an $In_{0.5}(Ga_{1-x2}Al_{x2})_{0.5}P$ upper optical confinement layer 35, and a two-pair $In_{0.5}Al_{0.5}P$ (thickness: $\lambda/4n_{InAlP}$)/$In_{0.5}(Ga_{1-x1}Al_{x1})_{0.5}P$ (thickness: $\lambda/4n_{InGaAlP}$) distributed reflection film 36 (which may be omitted) are overlaid in this order on a GaAs substrate 31 and with a metalorganic chemical vapor deposition technique. The compositions described above should preferably satisfy the conditions $0 \leq x4 < x3 \leq 1$, $x4 < x2 < x5 \leq 1$, $0 \leq x3 < x1 \leq x2$, and $x3 < x5 < 1$. Thereafter, a 12-pair SiO$_2$ (thickness: $\lambda/4n_{SiO2}$)/ZrO$_2$ (thickness: $\lambda/4n_{ZrO2}$) distributed reflection film 37 is overlaid on the two-pair $In_{0.5}Al_{0.5}P$ (thickness: $\lambda/4n_{InAlP}$)/$In_{0.5}(Ga_{1-x1}Al_{x1})_{0.5}P$ (thickness: $\lambda/4n_{InGaAlP}$) distributed reflection film 36 and with an electron beam vacuum evaporation technique, or the like. Thereafter, the GaAs substrate 31 is polished, and a region of the GaAs substrate 31, which region corresponds to a light emission region, is removed with a sulfuric acid type of etchant. At this time, the etching terminates automatically when the $In_{0.5}(Ga_{1-x5}Al_{x5})_{0.5}P$ cladding layer 32 is laid bare. Thereafter, a ZrO$_2$ (thickness: $\lambda/4n_{ZrO2}$) non-reflection coating film 38 is formed on the region of the $In_{0.5}(Ga_{1-x5}Al_{x5})_{0.5}P$ cladding layer 32, which region has been laid bare by the etching, and on the remaining regions of the GaAs substrate 31. Thereafter, chip formation is performed through cleavage, and a surface emission type of semiconductor device 39 is thereby formed.

The wavelength of the laser beam produced by the surface emission type of semiconductor device 39 can be controlled by the $In_{0.5}(Ga_{1-x4}Al_{x4})_{0.5}P$ quantum well active layer such that the wavelength may fall within the range of 600 nm to 700 nm.

How the first embodiment of the semiconductor laser apparatus in accordance with the present invention is constituted will be described hereinbelow.

Figure 3:
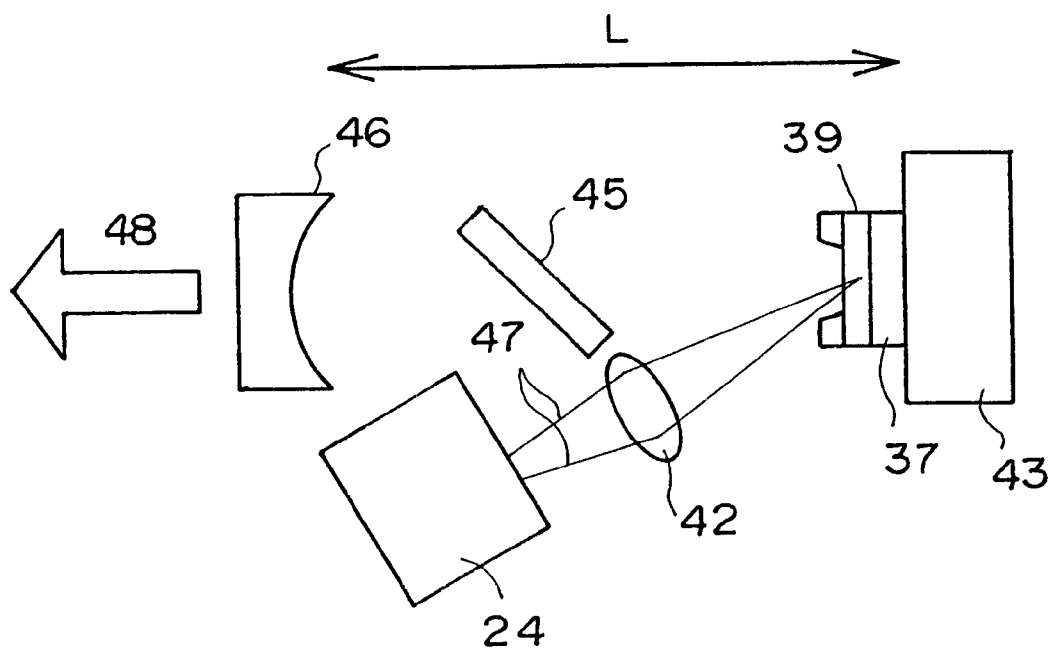
FIG. 3 is an explanatory view showing the first embodiment of the semiconductor laser apparatus in accordance with the present invention.

As illustrated in FIG. 3, the first embodiment of the semiconductor laser apparatus in accordance with the present invention comprises the semiconductor laser device 24 acting as the pumping beam source, and a converging lens 42. The semiconductor laser apparatus also comprises a heat sink 43, and the surface emission type of semiconductor device 39, which is located such that the end face on the side of the 12-pair SiO$_2$ (thickness: $\lambda/4n_{SiO2}$)/ZrO$_2$ (thickness: $\lambda/4n_{ZrO2}$) distributed reflection film 37 is adhered to the heat sink 43. The semiconductor laser apparatus further comprises a concave mirror 46, which acts as an output mirror. The concave surface of the concave mirror 46 constitutes an external resonator (resonator length: L) in co-operation with the distributed reflection film 37 of the surface emission type of semiconductor device 39. The semiconductor laser apparatus still further comprises a Brewster plate 45, which is located within the external resonator. The Brewster plate 45 controls polarization. A wavelength selecting device may be located within the external resonator. The wavelength selecting device may be constituted of, for example, at least one Lyot filter or at least one etalon.

A pumping beam 47 is radiated out from the semiconductor laser device 24. The pumping beam 47 is converged by the converging lens 42 to a position within the semiconductor layer of the surface emission type of semiconductor device 39. Light produced by the surface emission type of semiconductor device 39 is caused by the external resonator to resonate, and a red laser beam 48 is radiated out from the output mirror 46.

The GaAs substrate 31 of the surface emission type of semiconductor device 39 is not transparent with respect to the pumping beam 47 radiated out from the semiconductor laser device 24 for the optical pumping. Therefore, as illustrated in FIG. 3, the surface emission type of semiconductor device 39 is pumped from the side.

The first embodiment of the semiconductor laser apparatus in accordance with the present invention has the characteristics in that a quickly modulated laser beam can be obtained by directly modulating the semiconductor laser device 24. The characteristics could not be obtained with the conventional solid laser.

Also, with the first embodiment of the semiconductor laser apparatus in accordance with the present invention, wherein the optical pumping is performed, the problems do not occur in that heat is generated due to injection of an electric current as in the ordinary electric current injection type of semiconductor laser device. Further, a semiconductor laser apparatus having a long service life can be obtained.

Further, with the first embodiment of the semiconductor laser apparatus in accordance with the present invention, the transverse mode can be controlled with the external mirror, and therefore no side lobe arises. In cases where a side lobe arises, the side lobe can be restricted by inserting a slit, or the like, into the external resonator.

In the first embodiment of the semiconductor laser apparatus in accordance with the present invention, the GaAs substrate 31 is an absorption medium with respect to the produced laser beam. Therefore, it is efficient that a pinhole-like hole, which is formed by accurately making the GaAs substrate 31 thin with etching, or the like, is utilized for mode control.

A second embodiment of the semiconductor laser apparatus in accordance with the present invention will be described hereinbelow.

Figure 4:
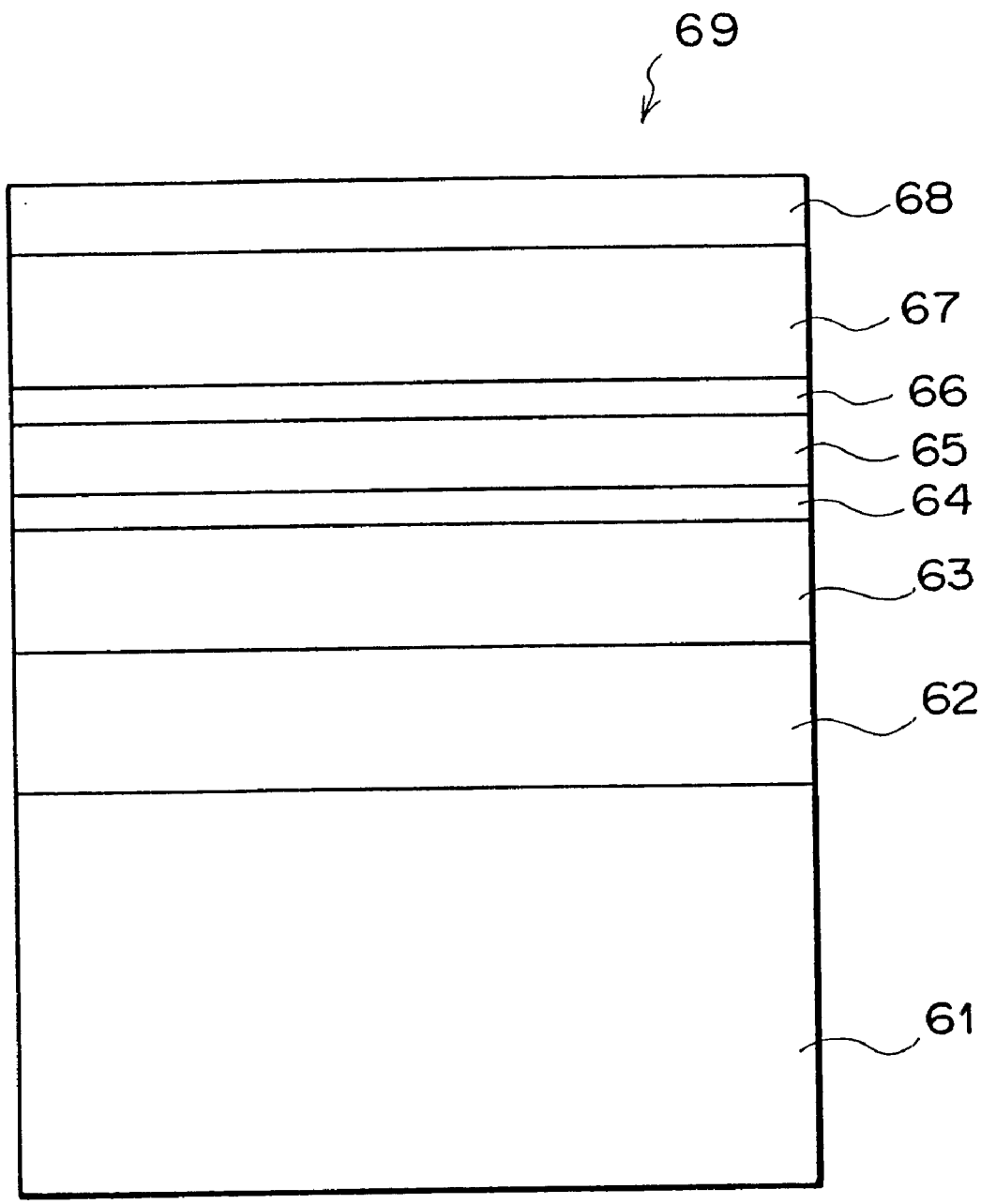
FIG. 4 is a sectional view showing a surface emission type of semiconductor device, which is employed in a second embodiment of the semiconductor laser apparatus in accordance with the present invention.

How the surface emission type of semiconductor device, which is employed in the second embodiment of the semiconductor laser apparatus in accordance with the present invention, is constituted and produced will be described hereinbelow. FIG. 4 is a sectional view showing the surface emission type of semiconductor device, which is employed in the second embodiment of the semiconductor laser apparatus in accordance with the present invention. In the explanation made below, λ represents the wavelength of the laser beam produced through the optical pumping. Also, $n_{InAlP}$, $n_{InGaAlP}$, and $n_{ZrO2}$ respectively represent the refractive indexes of InAlP, InGaAlP, and $ZrO_2$ with respect to the wavelength of the laser beam produced through the optical pumping.

As illustrated in FIG. 4, a 30-pair $In_{0.5}(Ga_{1-x1}Al_{x1})_{0.5}P$ (thickness: $λ/4n_{InGaAlP}$)/$In_{0.5}Al_{0.5}P$ (thickness: $λ/4n_{InAlP}$) distributed reflection film 62, an $In_{0.5}(Ga_{1-x2}Al_{x2})_{0.5}P$ lower cladding layer 63, an $In_{0.5}(Ga_{1-x2}Al_{x2})_{0.5}P$ lower optical confinement layer 64, an $In_{0.5}(Ga_{1-x3}Al_{x3})_{0.5}P/In_{0.5}(Ga_{1-x4}Al_{x4})_{0.5}P$ multiple quantum well active layer 65, an $In_{0.5}(Ga_{1-x2}Al_{x2})_{0.5}P$ upper optical confinement layer 66, and an $In_{0.5}(Ga_{1-x5}Al_{x5})_{0.5}P$ upper cladding layer 67 are overlaid in this order on a GaAs substrate 61 and with the metalorganic chemical vapor deposition technique. The compositions described above should preferably satisfy the conditions $0≦x4<x3≦1$, $x4<x2<x5≦1$, $0≦x3<x1≦x2$, and $x3<x5<1$. Thereafter, a $ZrO_2$ (thickness: $λ/4n_{ZrO2}$) non-reflection coating film 68 is overlaid on the $In_{0.5}(Ga_{1-x5}Al_{x5})_{0.5}P$ upper cladding layer 67 and with the electron beam vacuum evaporation technique, or the like. Thereafter, the GaAs substrate 61 is polished, chip formation is performed through cleavage, and a surface emission type of semiconductor device 69 is thereby formed.

The wavelength of the laser beam produced by the surface emission type of semiconductor device 69 can be controlled by the $In_{0.5}(Ga_{1-x4}Al_{x4})_{0.5}P$ quantum well active layer such that the wavelength may fall within the range of 600 nm to 700 nm.

The end face of the surface emission type of semiconductor device 69 on the side of the GaAs substrate 61 is secured to a heat sink. Also, in the same manner as that in the first embodiment of the semiconductor laser apparatus in accordance with the present invention, for example, the surface emission type of semiconductor device 69 is pumped by, for example, the semiconductor laser device 24, and a resonator is constituted by an external mirror and the distributed reflection film 62. In this manner, laser oscillation in the fundamental transverse mode can be obtained, and a red laser beam having a high intensity can thereby be produced.

Figure 5:
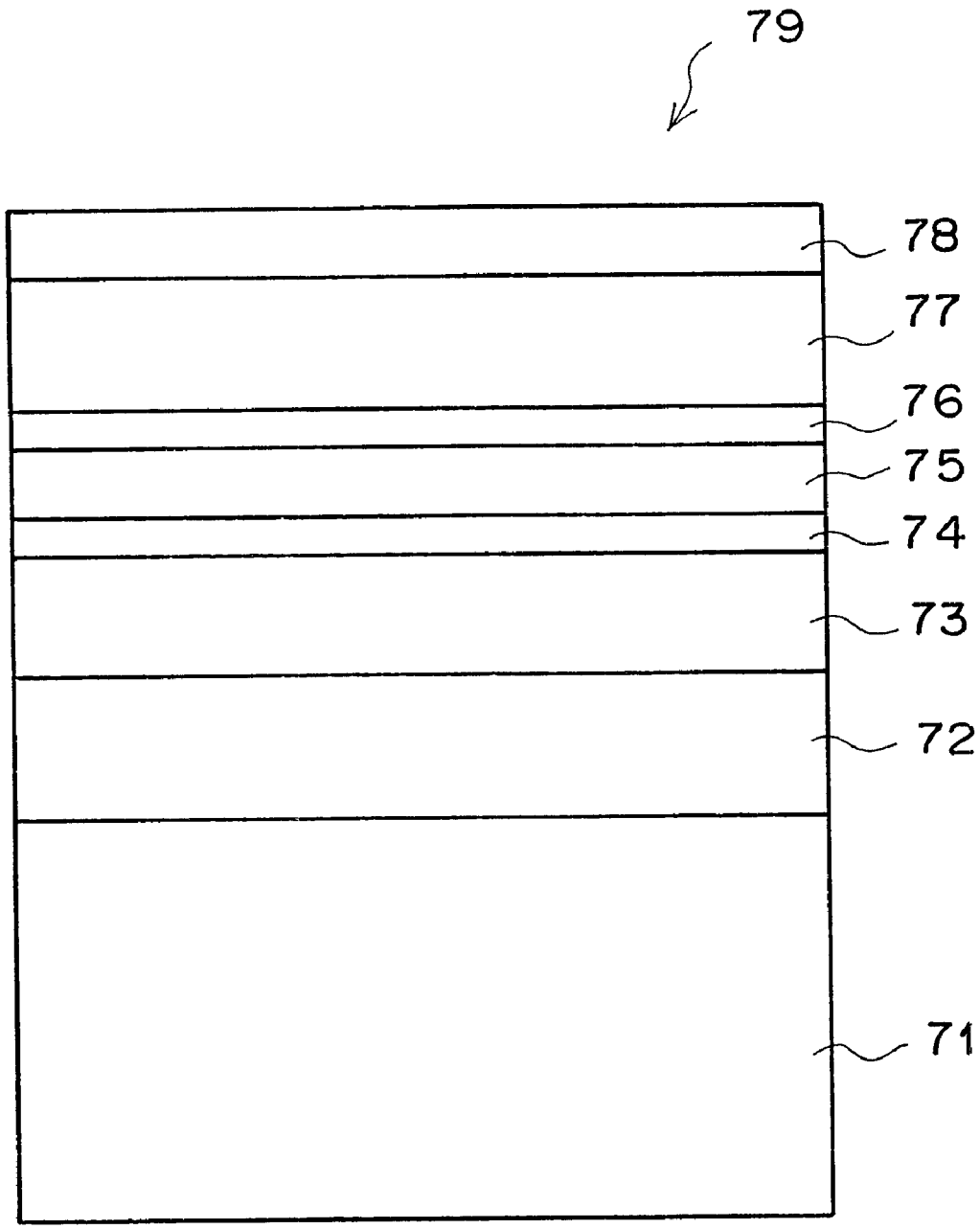
FIG. 5 is a sectional view showing a surface emission type of semiconductor device, which is employed in a third embodiment of the semiconductor laser apparatus in accordance with the present invention.
Figure 6:
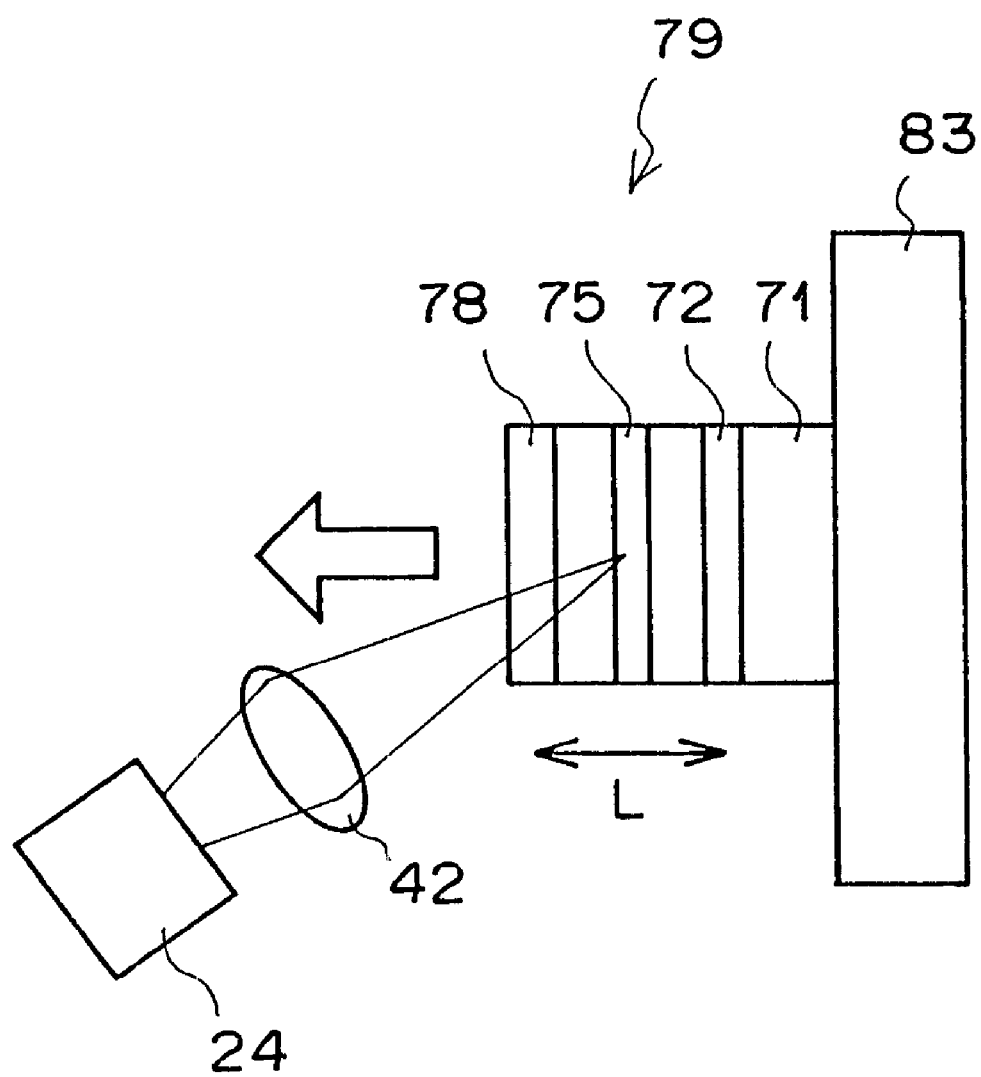
FIG. 6 is an explanatory view showing the third embodiment of the semiconductor laser apparatus in accordance with the present invention.

A third embodiment of the semiconductor laser apparatus in accordance with the present invention will be described hereinbelow. FIG. 5 is a sectional view showing a surface emission type of semiconductor device, which is employed in the third embodiment of the semiconductor laser apparatus in accordance with the present invention. FIG. 6 is an explanatory view showing the third embodiment of the semiconductor laser apparatus in accordance with the present invention.

Firstly, how the surface emission type of semiconductor device, which is employed in the third embodiment of the semiconductor laser apparatus in accordance with the present invention, is constituted and produced will be described hereinbelow. In the explanation made below, λ represents the wavelength of the laser beam produced through the optical pumping. Also, $n_{InAlP}$ and $n_{InGaAlP}$ respectively represent the refractive indexes of InAlP and InGaAlP with respect to the wavelength of the laser beam produced through the optical pumping.

As illustrated in FIG. 5, a 30-pair $In_{0.5}(Ga_{1-x1}Al_{x1})_{0.5}P$ (thickness: $λ/4n_{InGaAlP}$)/$In_{0.5}Al_{0.5}P$ (thickness: $λ/4n_{InAlP}$) distributed reflection film 72, an $In_{0.5}(Ga_{1-x2}Al_{x2})_{0.5}P$ lower cladding layer 73, an $In_{0.5}(Ga_{1-x2}Al_{x2})_{0.5}P$ lower optical confinement layer 74, an $In_{0.5}(Ga_{1-x3}Al_{x3})_{0.5}P/In_{0.5}(Ga_{1-x4}Al_{x4})_{0.5}P$ multiple quantum well active layer 75, an $In_{0.5}(Ga_{1-x2}Al_{x2})_{0.5}P$ upper optical confinement layer 76, and an $In_{0.5}(Ga_{1-x5}Al_{x5})_{0.5}P$ upper cladding layer 77 are overlaid in this order on a GaAs substrate 71 and with the metalorganic chemical vapor deposition technique. The compositions described above should preferably satisfy the conditions $0≦x4<x3≦1$, $x4<x2<x5≦1$, $0≦x3<x1≦x2$, and $x3<x5<1$. Thereafter, a dielectric mirror 78 constituted of a dielectric substance having a reflectivity of 95% is overlaid on the $In_{0.5}(Ga_{1-x5}Al_{x5})_{0.5}P$ upper cladding layer 77 and with the electron beam vacuum evaporation technique, or the like. Thereafter, the GaAs substrate 71 is polished, chip formation is performed through cleavage, and a surface emission type of semiconductor device 79 is thereby formed.

How the third embodiment of the semiconductor laser apparatus in accordance with the present invention, in which the surface emission type of semiconductor device 79 is employed, is constituted will be described hereinbelow. As illustrated in FIG. 6, in the third embodiment of the semiconductor laser apparatus in accordance with the present invention, the end face of the surface emission type of semiconductor device 79 on the side of the GaAs substrate 71 is secured to a heat sink 83. The surface emission type of semiconductor device 79 is pumped by, for example, the semiconductor laser device 24 via the converging lens 42. Also, a resonator (resonator length: L) is constituted by the dielectric mirror 78 and the distributed reflection film 72. In this manner, laser oscillation in the fundamental transverse mode can be obtained, and a red laser beam having a high intensity can thereby be produced.

In each of the first, second, and third embodiments described above, the semiconductor laser device for the optical pumping may be driven in a pulsed mode, and the semiconductor laser apparatus may thereby be driven in the pulsed mode. In particular, the InGaN type of semiconductor laser device for the optical pumping has a COD value (i.e., the maximum optical intensity at the time of end face breakage) higher than the COD values of the other semiconductor laser devices. Therefore, the InGaN type of semiconductor laser device is a pumping beam source appropriate for the driving in the pulsed mode.

Figure 7:
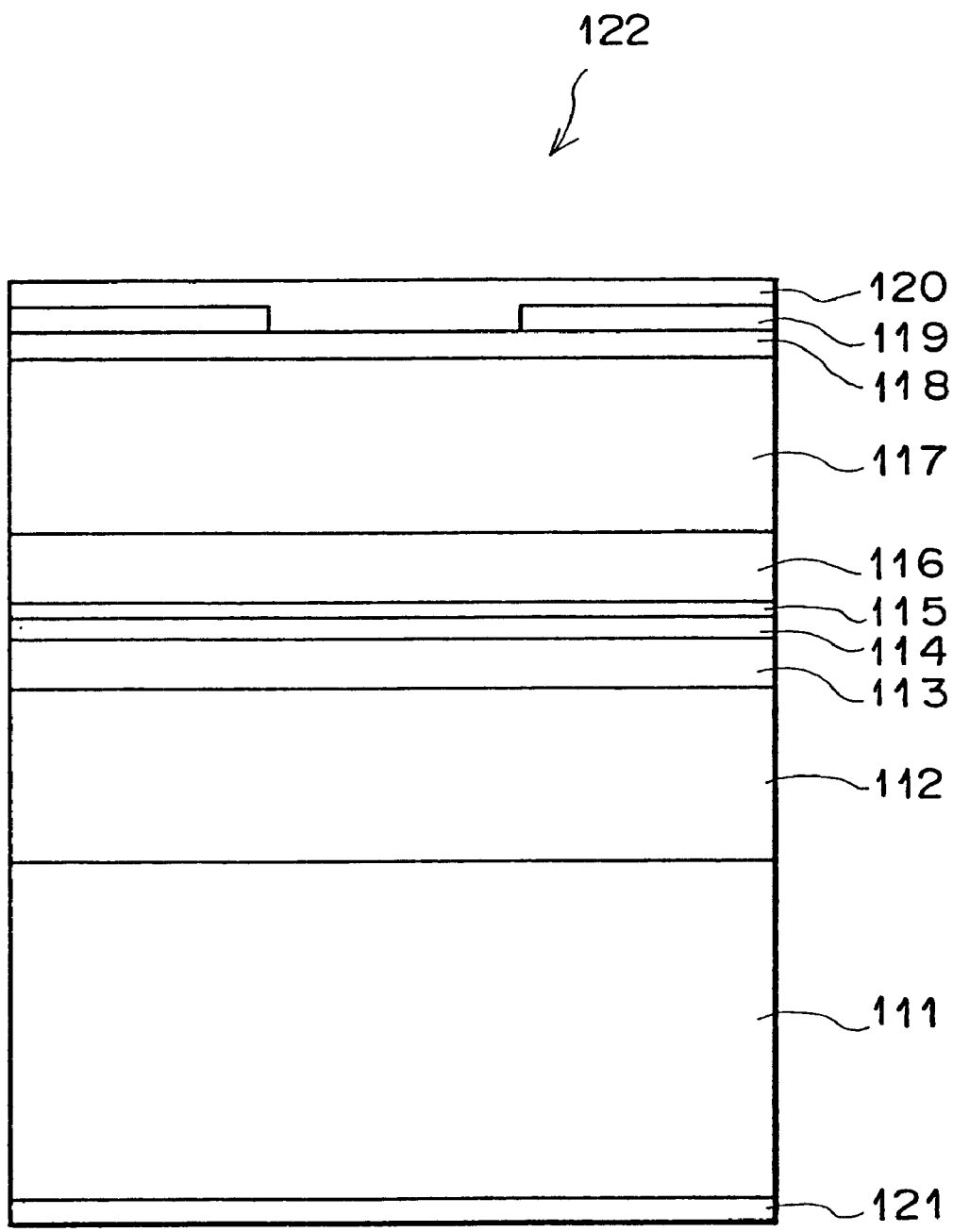
FIG. 7 is a sectional view showing a semiconductor laser device, which is employed in a fourth embodiment of the semiconductor laser apparatus in accordance with the present invention.
Figure 8:
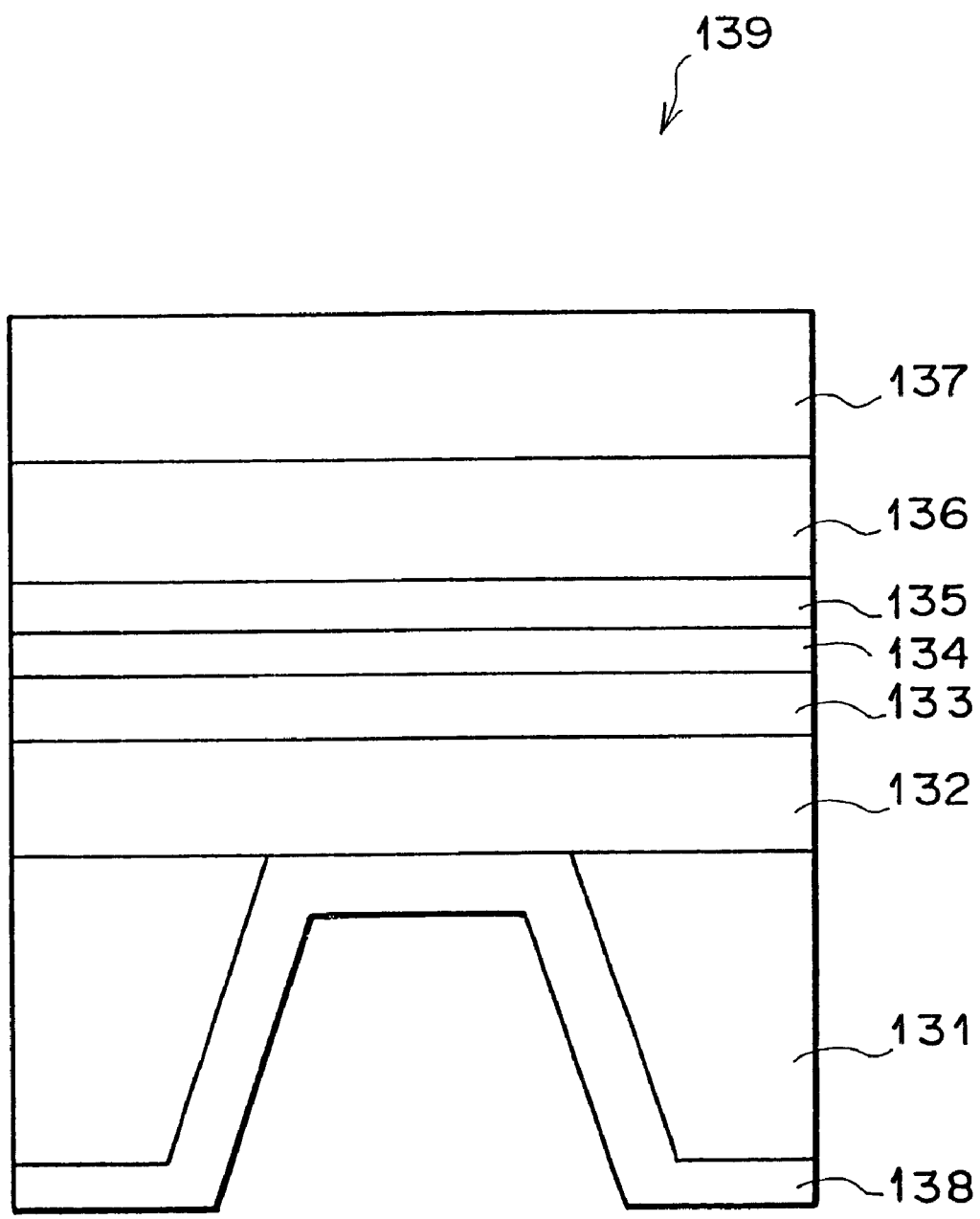
FIG. 8 is a sectional view showing a surface emission type of semiconductor device, which is employed in the fourth embodiment of the semiconductor laser apparatus in accordance with the present invention.
Figure 9:
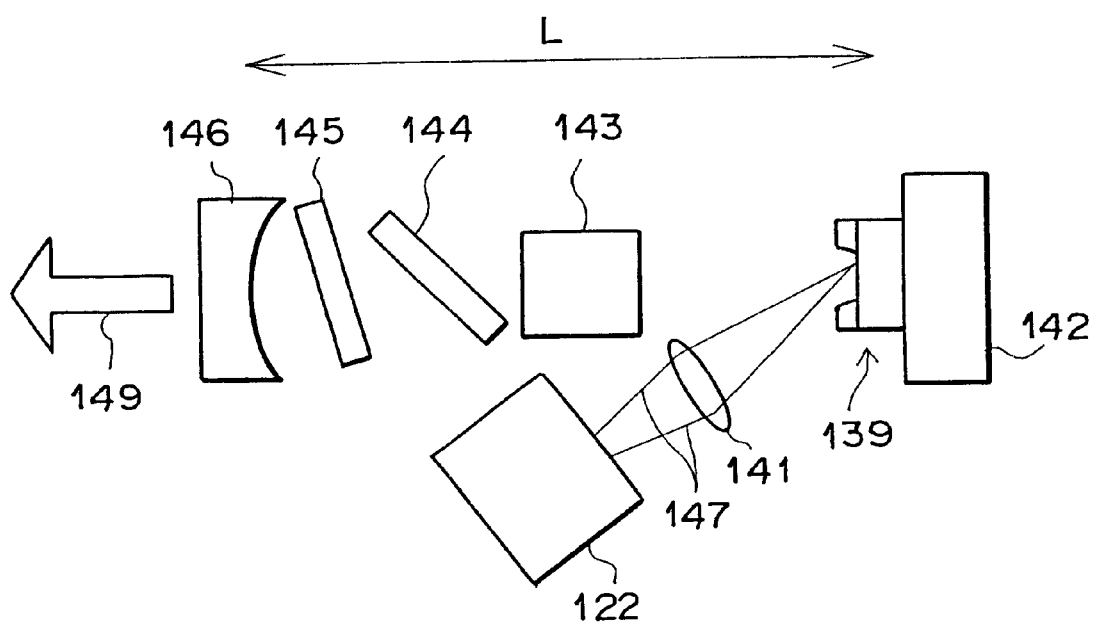
FIG. 9 is an explanatory view showing the fourth embodiment of the semiconductor laser apparatus in accordance with the present invention.

A fourth embodiment of the semiconductor laser apparatus in accordance with the present invention, which radiates out a laser beam having a wavelength of the ultraviolet region, will be described hereinbelow. FIG. 7 is a sectional view showing a semiconductor laser device, which is employed as a pumping beam source in the fourth embodiment of the semiconductor laser apparatus in accordance with the present invention and which produces a pumping beam having a wavelength of a 400 nm band. FIG. 8 is a sectional view showing a surface emission type of semiconductor device, which is employed in the fourth embodiment of the semiconductor laser apparatus in accordance with the present invention. FIG. 9 is an explanatory view showing the fourth embodiment of the semiconductor laser apparatus in accordance with the present invention.

Firstly, how the semiconductor laser device, which is employed for the optical pumping in the fourth embodiment of the semiconductor laser apparatus in accordance with the present invention, is constituted and produced will be described hereinbelow. An n-GaN (0001) substrate 111 is firstly formed in accordance with the technique described in "Jpn. Appl. Phys. Lett.," Vol. 37, pp. L1020, 1998. Thereafter, as illustrated in FIG. 7, an n-$Ga_{1-z1}Al_{z1}N$/GaN superlattice cladding layer 112 (where $0<z1<1$), an n- or i-GaN optical waveguide layer 113, an $In_{z2}Ga_{1-z2}N$/$In_{z3}Ga_{1-z3}N$ multiple quantum well active layer 114 (where $0<z2<z3<0.2$), a p-GaAlN carrier blocking layer 115, an n- or i-GaN optical waveguide layer 116, a p-$Ga_{1-z1}Al_{z1}N$/GaN superlattice cladding layer 117, and a p-GaN contact layer 118 are formed in this order on the n-GaN (0001) substrate 111 and with a metalorganic chemical vapor deposition technique. Thereafter, an insulating film 119 is formed on the p-GaN contact layer 118. Also, a stripe-shaped region of the insulating film 119, which region has a width of approximately 100 μm, is removed with an ordinary lithographic technique, and a p-side electrode 120 is formed on the region of the p-GaN contact layer 118, which region corresponds to the removed stripe-shaped region of the insulating film 119 and is now laid bare, and on the remaining regions of the insulating film 119. Thereafter, the n-GaN (0001) substrate 111 is polished, an n-side electrode 121 is formed on the bottom surface of the n-GaN (0001) substrate 111, and a resonator is formed through cleavage. Thereafter, high-reflectivity coating and low-reflectivity coating are performed on the resonator, and chip formation is performed. In this manner, a semiconductor laser device 122 is obtained.

As described above, the active layer 114 has the composition of InGaN. Alternatively, the active layer 114 may have the composition of GaN, GaNAs, or InGaNAs.

How the surface emission type of semiconductor device, which is employed in the fourth embodiment of the semiconductor laser apparatus in accordance with the present invention, is constituted and produced will be described hereinbelow. In the explanation made below, λ represents the wavelength of the laser beam produced through the optical pumping. Also, $n_{InAlP}$, $n_{InGaAlP}$, $n_{SiO2}$, and $n_{ZrO2}$ respectively represent the refractive indexes of InAlP, InGaAlP, $SiO_2$, and $ZrO_2$ with respect to the wavelength of the laser beam produced through the optical pumping.

As illustrated in FIG. 8, an $In_{0.5}(Ga_{1-x5}Al_{x5})_{0.5}P$ cladding layer 132 (where $0<x5<1$), an $In_{0.5}(Ga_{1-x2}Al_{x2})_{0.5}P$ lower optical confinement layer 133, an $In_{0.5}(Ga_{1-x3}Al_{x3})_{0.5}P/In_{0.5}(Ga_{1-x4}Al_{x4})_{0.5}P$ multiple quantum well active layer 134 (where $0<x3<x1\leq x2$, $x3<x5<1$, and $0\leq x4<x3$), an $In_{0.5}(Ga_{1-x2}Al_{x2})_{0.5}P$ upper optical confinement layer 135, and a two-pair $In_{0.5}Al_{0.5}P$ (thickness: $\lambda/4n_{InAlP}$)/$In_{0.5}(Ga_{1-x1}Al_{x1})_{0.5}P$ (thickness: $\lambda/4n_{InGaAlP}$) distributed reflection film 136 are overlaid in this order on a GaAs substrate 131 and with the metalorganic chemical vapor deposition technique. The distributed reflection film 136 may be omitted. Thereafter, a $SiO_2$ (thickness: $\lambda/4n_{SiO2}$)/$ZrO_2$ (thickness: $\lambda/4n_{ZrO2}$) distributed reflection film 137 is overlaid on the distributed reflection film 136 and with the electron beam vacuum evaporation technique. Thereafter, the GaAs substrate 131 is polished, and a region of the GaAs substrate 131, which region corresponds to a light emission region, is removed with a sulfuric acid type of etchant. At this time, the etching terminates automatically when the $In_{0.5}(Ga_{1-x5}Al_{x5})_{0.5}P$ cladding layer 132 is laid bare. Thereafter, a $ZrO_2$ (thickness: $\lambda/4n_{ZrO2}$) non-reflection coating film 138 is formed on the region of the $In_{0.5}(Ga_{1-x5}Al_{x5})_{0.5}P$ cladding layer 132, which region has been laid bare by the etching, and on the remaining regions of the GaAs substrate 131. Thereafter, chip formation is performed through cleavage, and a surface emission type of semiconductor device 139 is thereby formed.

The wavelength λ of the laser beam produced by the surface emission type of semiconductor device 139 can be controlled by the $In_{0.5}(Ga_{1-x4}Al_{x4})_{0.5}P$ multiple quantum well active layer 134 such that the wavelength λ may fall within the range of $600<\lambda<700$ (nm).

How the fourth embodiment of the semiconductor laser apparatus in accordance with the present invention is constituted will be described hereinbelow.

As illustrated in FIG. 9, the fourth embodiment of the semiconductor laser apparatus in accordance with the present invention comprises the semiconductor laser device 122 acting as the pumping beam source, and a converging lens 141. The semiconductor laser apparatus also comprises a heat sink 142, and the surface emission type of semiconductor device 139, which is located such that the end face on the side of the $SiO_2$ (thickness: $\lambda/4n_{SiO2}$)/$ZrO_2$ (thickness: $\lambda/4n_{ZrO2}$) distributed reflection film 137 is secured to the heat sink 142. The semiconductor laser apparatus further comprises an external mirror 146. A resonator (resonator length: L) is constituted by the concave surface of the external mirror 146 and the $SiO_2$ (thickness: $\lambda/4n_{SiO2}$)/$ZrO_2$ (thickness: $\lambda/4n_{ZrO2}$) distributed reflection film 137 of the surface emission type of semiconductor device 139. A wavelength converting device 143 (which may be constituted of, for example, a β-$BaBO_3$ crystal) and an etalon 145 are located within the resonator.

A pumping beam 147 having a wavelength of a 400 nm band is radiated out from the semiconductor laser device 122. The pumping beam 147 is converged by the converging lens 141 onto the surface emission type of semiconductor device 139. The pumping beam 147 is efficiently absorbed by the active layer 134 of the surface emission type of semiconductor device 139, and light having a wavelength of 680 nm is produced by the surface emission type of semiconductor device 139. The light produced by the surface emission type of semiconductor device 139 is subjected to wavelength conversion performed by the wavelength converting device 143, and a laser beam 149 having a wavelength of 340 nm is radiated out from the external mirror 146. Since the etalon 145 is inserted into the resonator, noise due to longitudinal mode competition of the wavelength-converted beam can be restricted. In lieu of the etalon 145, a Lyot filter may be employed. Alternatively, a plurality of etalons or a plurality of Lyot filters may be inserted into the resonator.

Also, a polarization control device 144, such as a Brewster plate, may be inserted into the resonator to control the polarization.

In the fourth embodiment of the semiconductor laser apparatus in accordance with the present invention, the broad area type of semiconductor laser device can be utilized as the pumping beam source. Therefore, the semiconductor laser device can have a high output power falling within the range of, for example, 1 W to at least 10 W. Accordingly, the fourth embodiment of the semiconductor laser apparatus in accordance with the present invention can have an output power falling within the range of several hundreds of milliwatts to at least several watts.

Also, with the fourth embodiment of the semiconductor laser apparatus in accordance with the present invention, wherein laser oscillation is pumped optically, the problems do not occur in that heat is generated due to injection of an electric current as in the electric current injection type of semiconductor laser device. Further, a semiconductor laser apparatus having a long service life can be obtained.

Further, with the fourth embodiment of the semiconductor laser apparatus in accordance with the present invention, wherein the light emission area of the surface emission type of semiconductor device 139 is broad, the optical density can be kept low. Therefore, the fourth embodiment of the semiconductor laser apparatus in accordance with the present invention has a long service life and a high output power.

Furthermore, with the fourth embodiment of the semiconductor laser apparatus in accordance with the present invention, the transverse mode can be controlled with the external mirror 146, and therefore no side lobe arises. In cases where a side lobe arises, the side lobe can be restricted by inserting a pinhole, or the like, into the resonator.

Figure 10:
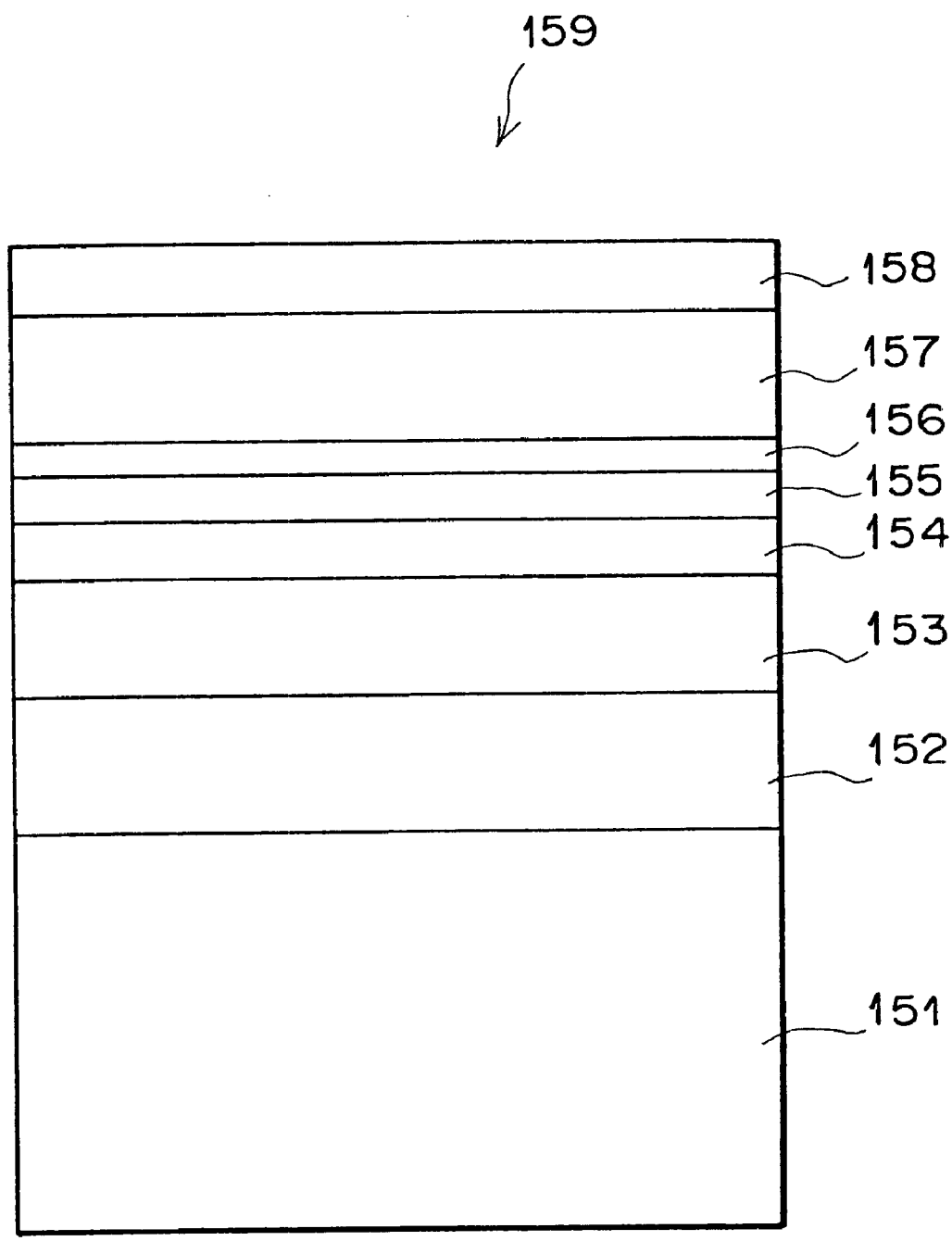
FIG. 10 is a sectional view showing a surface emission type of semiconductor device, which is employed in a fifth embodiment of the semiconductor laser apparatus in accordance with the present invention.

A fifth embodiment of the semiconductor laser apparatus in accordance with the present invention, which radiates out a laser beam having a wavelength of the ultraviolet region, will be described hereinbelow. FIG. 10 is a sectional view showing a surface emission type of semiconductor device, which is employed in the fifth embodiment of the semiconductor laser apparatus in accordance with the present invention. The fifth embodiment of the semiconductor laser apparatus in accordance with the present invention is constituted basically in the same manner as that in the fourth embodiment described above, except for the surface emission type of semiconductor device. In the explanation made below, $\lambda$ represents the wavelength of the laser beam produced through the optical pumping. Also, $n_{InAlP}$, $n_{InGaAlP}$, and $n_{ZrO2}$ respectively represent the refractive indexes of InAlP, InGaAlP, and $ZrO_2$ with respect to the wavelength of the laser beam produced through the optical pumping.

As illustrated in FIG. 10, a 30-pair $In_{0.5}(Ga_{1-x1}Al_{x1})_{0.5}P$ (thickness: $\lambda/4n_{InGaAlP}$)/$In_{0.5}Al_{0.5}P$ (thickness: $\lambda/4n_{InAlP}$) distributed reflection film 152, an $In_{0.5}(Ga_{1-x5}Al_{x5})_{0.5}P$ cladding layer 153, an $In_{0.5}(Ga_{1-x2}Al_{x2})_{0.5}P$ lower optical confinement layer 154, an $In_{0.5}(Ga_{1-x3}Al_{x3})_{0.5}P$/$In_{0.5}(Ga_{1-x4}Al_{x4})_{0.5}P$ multiple quantum well active layer 155 (where $0 \leq x3 < x1 \leq x2$, $x3 < x5 < 1$, and $0 \leq x4 < x3$), an $In_{0.5}(Ga_{1-x2}Al_{x2})_{0.5}P$ upper optical confinement layer 156, and an $In_{0.5}(Ga_{1-x5}Al_{x5})_{0.5}P$ cladding layer 157, and a $ZrO_2$ (thickness: $\lambda/4n_{ZrO2}$) distributed reflection film 158 are overlaid in this order on a GaAs substrate 151. In this manner, a surface emission type of semiconductor device 159 is formed.

As in the fourth embodiment of the semiconductor laser apparatus in accordance with the present invention, the surface emission type of semiconductor device 159 having been formed in the manner described above is located such that the end face on the side of the GaAs substrate 151 is secured to the heat sink. In this manner, the semiconductor laser apparatus is constituted. The $In_{0.5}(Ga_{1-x1}Al_{x1})_{0.5}P$ (thickness: $\lambda/4n_{InGaAlP}$)/$In_{0.5}Al_{0.5}P$ (thickness: $\lambda/4n_{InAlP}$) distributed reflection film 152 of the surface emission type of semiconductor device 159 acts as a mirror. In the fifth embodiment of the semiconductor laser apparatus in accordance with the present invention, as in the fourth embodiment described above, the semiconductor laser device 122 for producing a pumping beam having a wavelength of the 400 nm band is utilized as the pumping beam source. The surface emission type of semiconductor device 159 is pumped by the pumping beam source and produces light having a wavelength falling within the range of 600 nm to 700 nm. The light produced by the surface emission type of semiconductor device 159 is subjected to wavelength conversion, and a laser beam having a wavelength falling within the range of 300 nm to 350 nm is radiated out from the fifth embodiment of the semiconductor laser apparatus in accordance with the present invention.

Figure 11:
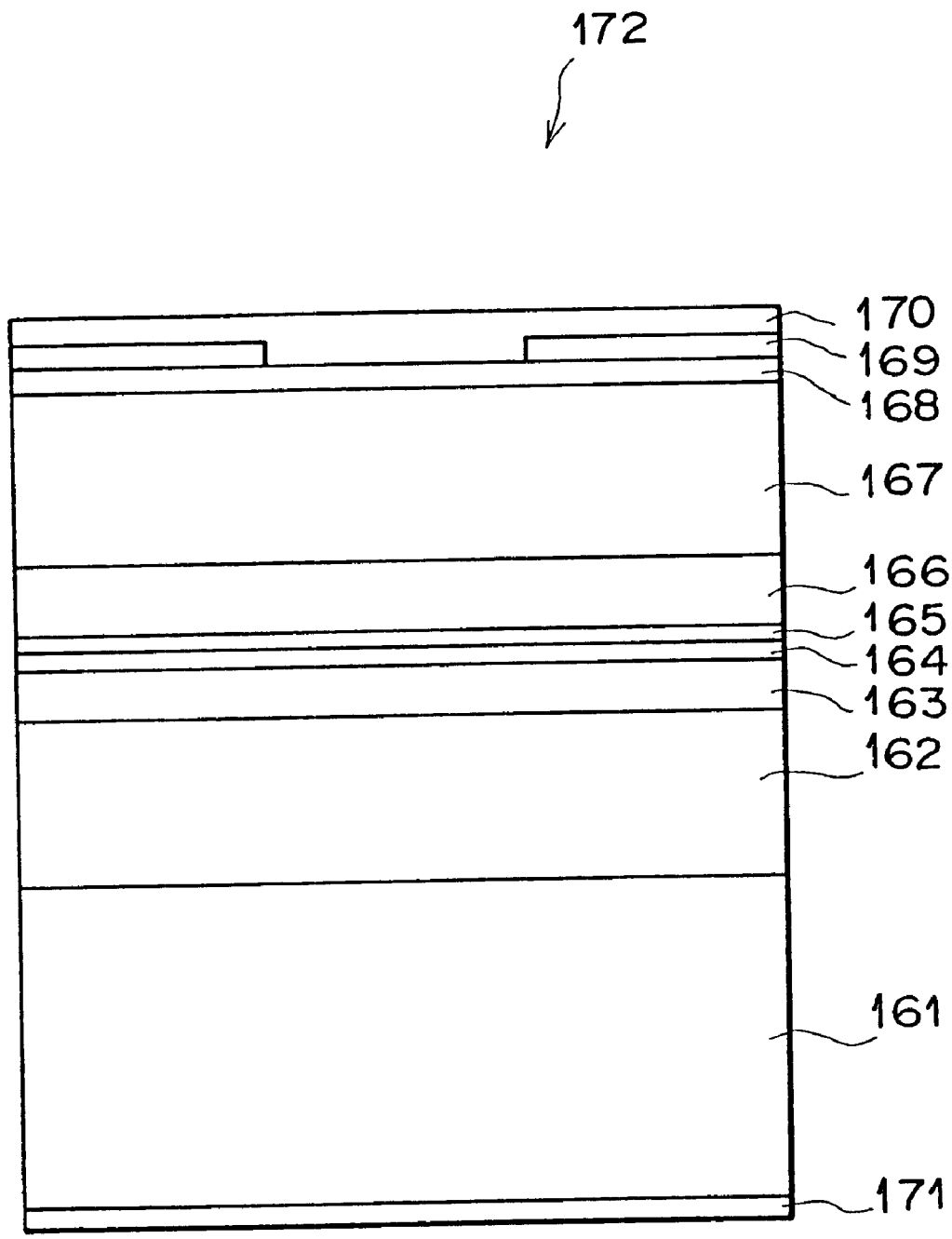
FIG. 11 is a sectional view showing a semiconductor laser device, which is employed in a sixth embodiment of the semiconductor laser apparatus in accordance with the present invention.
Figure 12:
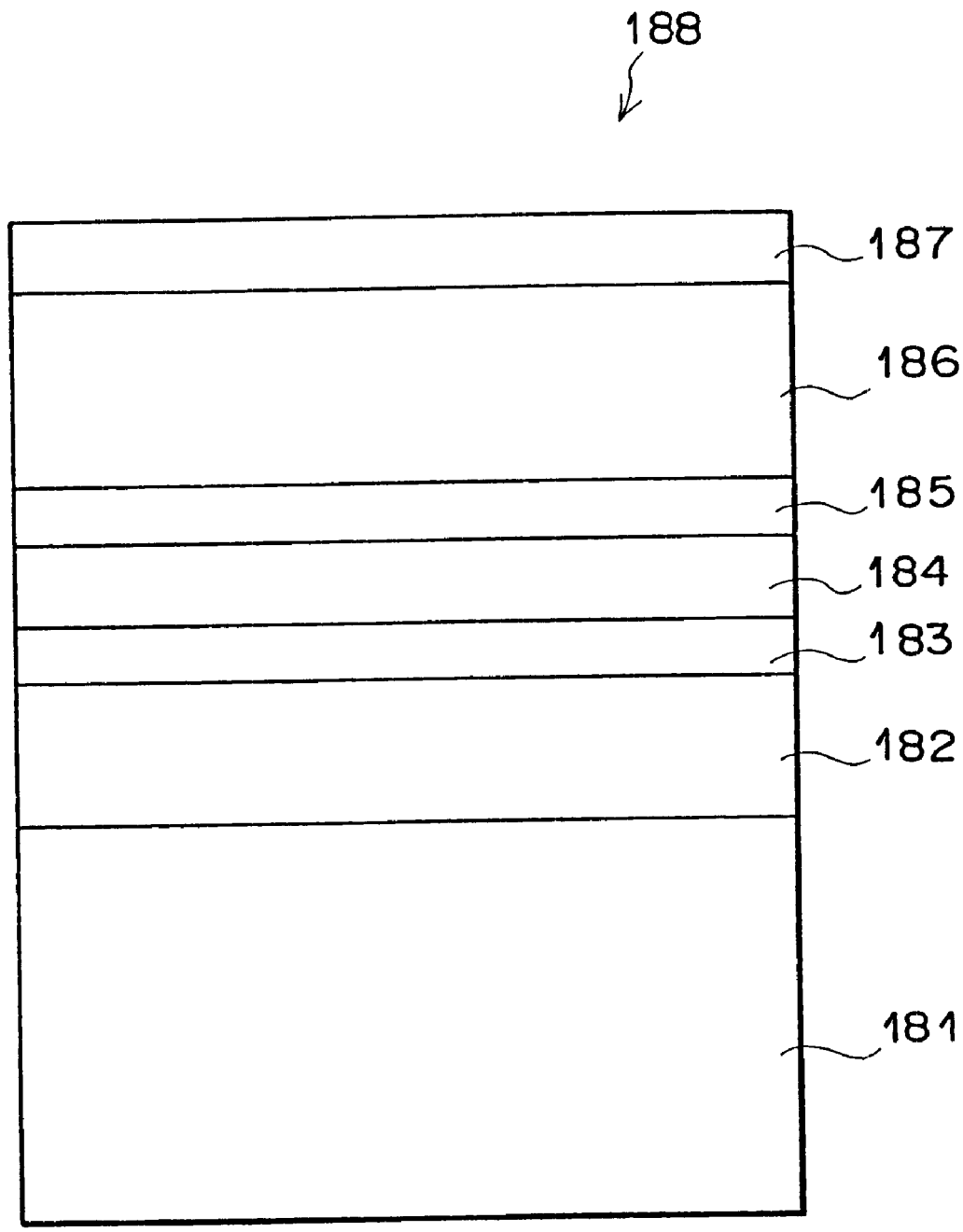
FIG. 12 is a sectional view showing a surface emission type of semiconductor device, which is employed in the sixth embodiment of the semiconductor laser apparatus in accordance with the present invention.
Figure 13:
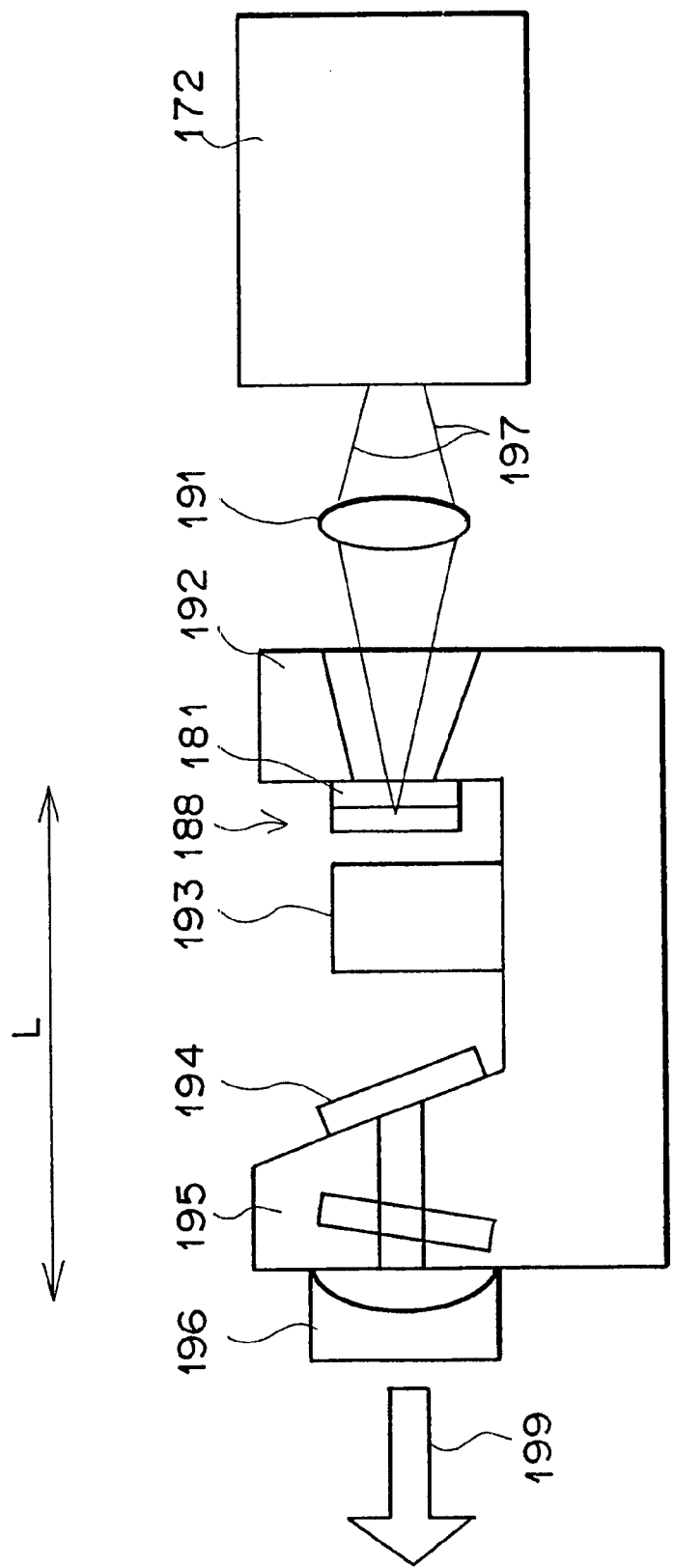
FIG. 13 is an explanatory view showing the sixth embodiment of the semiconductor laser apparatus in accordance with the present invention.

A sixth embodiment of the semiconductor laser apparatus in accordance with the present invention, which radiates out a laser beam having a wavelength of the ultraviolet region, will be described hereinbelow. FIG. 11 is a sectional view showing a semiconductor laser device, which is employed as a pumping beam source in the sixth embodiment of the semiconductor laser apparatus in accordance with the present invention and which produces a pumping beam having a wavelength of a 380 band. FIG. 12 is a sectional view showing a surface emission type of semiconductor device, which is employed in the sixth embodiment of the semiconductor laser apparatus in accordance with the present invention. FIG. 13 is an explanatory view showing the sixth embodiment of the semiconductor laser apparatus in accordance with the present invention.

Firstly, how the semiconductor laser device, which is employed for the optical pumping in the fifth embodiment of the semiconductor laser apparatus in accordance with the present invention, is constituted and produced will be described hereinbelow. As illustrated in FIG. 11, an n-$Ga_{1-z1}Al_{z1}N$/GaN superlattice cladding layer 162 (where $0 < z1 < 1$), an n- or i-GaN optical waveguide layer 163, an $In_{z2}Ga_{1-z2}N$/$In_{z3}Ga_{1-z3}N$ multiple quantum well active layer 164 (where $0 < z2 < z3 < 0.5$), a p-$Ga_{1-z3}Al_{z3}N$ carrier blocking layer 165, an n- or i-GaN optical waveguide layer 166, a p-$Ga_{1-z1}Al_{z1}N$/GaN superlattice cladding layer 167, and a p-GaN contact layer 168 are formed in this order on the n-GaN (0001) substrate 161 and with a metalorganic chemical vapor deposition technique. Thereafter, an insulating film 169 is formed on the p-GaN contact layer 168. Also, a stripe-shaped region of the insulating film 169, which region has a width of approximately 100 μm, is removed with an ordinary lithographic technique, and a p-side electrode 170 is formed on the region of the p-GaN contact layer 168, which region corresponds to the removed stripe-shaped region of the insulating film 169 and is now laid bare, and on the remaining regions of the insulating film 169. Thereafter, the n-GaN (0001) substrate 161 is polished, an n-side electrode 171 is formed on the bottom surface of the n-GaN (0001) substrate 161, and a resonator is formed through cleavage. Thereafter, high-reflectivity coating and low-reflectivity coating are performed on the resonator, and chip formation is performed. In this manner, a semiconductor laser device 172 is obtained.

How the surface emission type of semiconductor device, which is employed in the sixth embodiment of the semiconductor laser apparatus in accordance with the present invention, is constituted and produced will be described hereinbelow. In the explanation made below, $\lambda$ represents the wavelength of the laser beam produced through the optical pumping. Also, $n_{AlN}$, $n_{GaN}$, $n_{wg}$, $n_{SiO2}$, and $n_{ZrO2}$ respectively represent the refractive indexes of AlN, GaN, the optical confinement layer, $SiO_2$, and $ZrO_2$ with respect to the wavelength of the laser beam produced through the optical pumping.

As illustrated in FIG. 12, a 20-pair GaN (thickness: $\lambda/4n_{GaN}$)/AlN (thickness: $\lambda/4n_{AlN}$) reflecting film 182, a GaN optical confinement layer 183, an $In_{x2}Ga_{1-x2}N$/$In_{x3}Ga_{1-x3}N$ multiple quantum well active layer 184 (where $0 < x2 < x3 < 0.5$), a GaN optical confinement layer 185, and an AlGaN carrier confinement layer 186 are overlaid in this order on a GaN (0001) substrate 181 and with the metalorganic chemical vapor deposition technique. Thereafter, a $SiO_2$ (thickness: $\lambda/4n_{SiO2}$)/$ZrO_2$ (thickness: $\lambda/4n_{ZrO2}$) distributed reflection film 187 is overlaid on the AlGaN carrier confinement layer 186 and with the electron beam vacuum evaporation technique, or the like. Thereafter, the GaN (0001) substrate 181 is polished, and a $ZrO_2$ (thickness: $\lambda/4n_{ZrO2}$) non-reflection coating film (not shown) is formed. Thereafter, chip formation is performed through cleavage, and a surface emission type of semiconductor device 188 is thereby formed.

The wavelength $\lambda$ of the laser beam produced by the surface emission type of semiconductor device 188 can be controlled by the $In_{x2}Ga_{1-x2}N$/$In_{x3}Ga_{1-x3}N$ multiple quantum well active layer 184 (where $0 < x2 < x3 < 0.5$) such that the wavelength $\lambda$ may fall within the range of $400 < \lambda < 560$ (nm).

How the sixth embodiment of the semiconductor laser apparatus in accordance with the present invention is constituted will be described hereinbelow.

As illustrated in FIG. 13, the sixth embodiment of the semiconductor laser apparatus in accordance with the present invention comprises the semiconductor laser device 172 acting as the pumping beam source, and a converging lens 191. The semiconductor laser apparatus also comprises a heat sink 192, and the surface emission type of semiconductor device 188, which is located such that the end face on the side of the GaN (0001) substrate 181 is secured to the heat sink 192. The semiconductor laser apparatus further comprises an external mirror 196. A resonator (resonator length: L) is constituted by the concave surface of the external mirror 196 and the 20-pair GaN (thickness: $\lambda/4n_{GaN}$)/AlN (thickness: $\lambda/4n_{AlN}$) reflecting film 182 of the surface emission type of semiconductor device 188. A wavelength converting device 193 (which may be constituted of, for example, a β-BaBO₃ crystal) is inserted into the resonator. Also, in order for the single longitudinal mode to be obtained, a wavelength selecting device 195 is inserted into the resonator. The wavelength selecting device 195 may be constituted of, for example, at least one Lyot filter or at least one etalon. Further, in order for wavelength conversion to be performed efficiently, a polarization control device 194, such as a Brewster plate, may be inserted into the resonator.

A pumping beam 197 having a wavelength of a 380 nm band is radiated out from the semiconductor laser device 172. The pumping beam 197 is converged by the converging lens 191 onto the surface emission type of semiconductor device 188. The pumping beam 197 is efficiently absorbed by the quantum well active layer of the surface emission type of semiconductor device 188, and light having a wavelength falling within the range of 400 nm to 560 nm is produced by the surface emission type of semiconductor device 188. The light produced by the surface emission type of semiconductor device 188 is converted into its second harmonic by the wavelength converting device 193. As described above, the surface emission type of semiconductor device 188 is capable of producing the fundamental wave having a wavelength $\lambda_{FM}$ falling within the range of $400<\lambda_{FM}<560$ (nm). Therefore, with the sixth embodiment of the semiconductor laser apparatus in accordance with the present invention, the second harmonic having an extreme short wavelength $\lambda_{SHG}$ falling within the range of $200<\lambda_{SHG}<280$ (nm) can be radiated out.

In the sixth embodiment of the semiconductor laser apparatus in accordance with the present invention, the GaN (0001) substrate 181 of the surface emission type of semiconductor device 188 is transparent with respect to the pumping beam 197. Therefore, the surface emission type of semiconductor device 188 is pumped from its end face, and laser oscillation is thereby obtained. Also, the GaN (0001) substrate 181 has a high thermal conductivity. Therefore, in cases where the heat sink 192 is constituted in the manner shown in FIG. 13, heat dissipation can be effected easily, and a laser beam of good quality can be obtained.

As the wavelength converting device 193, in lieu of the β-BaBO₃ crystal, an LBO crystal, a GdYCOB crystal, a GdCOB crystal, a domain-inversion MgO—LiNbO₃ crystal, or the like, may be employed.

With the sixth embodiment of the semiconductor laser apparatus in accordance with the present invention, as in the fourth and fifth embodiments described above, modulation can be performed through direct modulation of the semiconductor laser device 172 for the optical pumping.

In the fourth, fifth, and sixth embodiments described above, the light produced by the surface emission type of semiconductor device is converted into its second harmonic, and the laser beam having a wavelength of the ultraviolet region is thereby obtained. Alternatively, the fourth, fifth, and sixth embodiments described above may be modified such that the light (fundamental wave) produced by the surface emission type of semiconductor device and a fundamental wave produced by an external light source are converted into a wave having a frequency equal to the sum of the frequencies of the fundamental waves, and the laser beam having a wavelength of the ultraviolet region is thereby obtained.

Also, in the fourth, fifth, and sixth embodiments described above, the broad area type of semiconductor laser device is employed as the semiconductor laser device for the optical pumping. Alternatively, one of other types of semiconductor laser devices, an MOPA laser having a tapered structure and capable of collecting light at a high density, an α-DFB laser, or the like, may be employed.

In the semiconductor laser apparatus in accordance with the present invention, a Q-switching device may be inserted into the resonator, and a Q-switching operation may thereby be performed. Alternatively, the semiconductor laser device for the optical pumping may be driven in the pulsed mode, and the semiconductor laser apparatus may thereby be driven in the pulsed mode. In particular, the InGaN type of semiconductor laser device for the optical pumping has a COD value higher than the COD values of the other semiconductor laser devices. Therefore, the InGaN type of semiconductor laser device is a pumping beam source appropriate for the driving in the pulsed mode.

The semiconductor laser apparatus in accordance with the present invention is also applicable as the light source for use in the fields of quick information processing, quick image processing, communication, instrumentation, medical treatment, printing, and the like.

In addition, all of the contents of Japanese Patent Application Nos. 11(1999)-257530, 11(1999)-292557 and 2000-046177 are incorporated into this specification by reference.

What is claimed is:

1. A semiconductor laser apparatus, comprising:
   i) a semiconductor laser device having an active layer made from a composition selected from the group consisting of InGaN-type and GaN-type compositions, said laser device having a stripe-shaped electric current injection window with a width of at least 5 μm, said laser device being employed as a pumping beam source to output a pumping beam having a wavelength of a 400 nm band and an output power ranging from 1 to 10 W;
   ii) a surface emission type semiconductor device with first and second end faces at opposite ends thereof, with the first end face thereof secured to a heat sink, and having at the second end face thereof a substrate of said surface emission type semiconductor device with a window etched therein,
   said surface emission type of semiconductor device being pumped by said semiconductor laser device; and
   iii) a wavelength converter constructed to receive the emission of said pumped surface emission type semiconductor device which converts a wavelength of light generated by pumping of said surface emission type semiconductor device to a laser beam that has a wavelength ranging from 300 nm to 350 nm and an output power ranging from several hundreds of milliwatts to several watts, which is radiated from said semiconductor laser apparatus.

2. A semiconductor laser apparatus, comprising:

i) a semiconductor laser device having a stripe-shaped electric current injection window with a width of at least 5 μm, and an InGaN-type active layer employed as a pumping beam source that outputs a pumping beam with a wavelength in the 380 nm band at an output power ranging from 1 to 10 W;

ii) a surface emission type semiconductor device having a GaN-type substrate and a GaN type active layer, said surface emission type semiconductor device being pumped by said semiconductor laser device, and iii) a wavelength converter constructed to receive and convert a wavelength of light generated by said pumping of said surface emission type semiconductor device to its second harmonic, thereby causing said semiconductor laser apparatus to generate a laser beam with a wavelength ranging from 200 nm to 280 nm.

* * * * *